United States Patent [19]

Masumoto

[11] Patent Number: 5,120,231
[45] Date of Patent: Jun. 9, 1992

[54] ELECTRONIC CIRCUIT APPARATUS
[75] Inventor: Yoshihide Masumoto, Himeji, Japan
[73] Assignee: Mitsubishi Denki Kabushiki Kaisha, Tokyo, Japan
[21] Appl. No.: 493,669
[22] Filed: Mar. 15, 1990
[30] Foreign Application Priority Data
Mar. 16, 1989 [JP] Japan .................. 1-29153[U]
[51] Int. Cl.⁵ ............................................ H01R 13/533
[52] U.S. Cl. ........................................ 439/76; 439/736
[58] Field of Search ............... 439/638, 76, 276, 936, 439/736

[56] References Cited
U.S. PATENT DOCUMENTS
4,290,664 9/1981 Davis et al. .................. 439/638
4,408,819 10/1983 Guelden ...................... 439/638

Primary Examiner—Gary F. Paumen
Attorney, Agent, or Firm—Sughrue, Mion, Zinn, Macpeak and Seas

[57] ABSTRACT

The connector of an electronic circuit apparatus has a locking portion formed on its outer circumference. An engagement body for engaging with this locking portion is provided at a through portion of a housing. With a non-elastic engagement of the engagement body with the locking portion, a sealing effect can be obtained, and the connector and the housing can be formed in one piece. Therefore, vibrations are prevented from occurring in an electronic circuit apparatus mounted in the circuit apparatus, so that high reliability can be obtained.

7 Claims, 2 Drawing Sheets

ELECTRONIC CIRCUIT APPARATUS

BACKGROUND OF THE INVENTION

1. Field of the Invention

The present invention relates to an electronic circuit apparatus, more particularly to an electronic circuit apparatus capable of preferably being used, for example, in an ignition timing control apparatus of an internal-combustion engine for vehicles.

2. Description of the Related Art

FIGS. 1 and 2 are a plan view and a cross-sectional side view each schematically illustrating an electronic circuit apparatus for use in an ignition timing control apparatus of internal-combustion engine for vehicles. In these figures, a circuit board 1, in which circuit devices (not shown) are mounted, is housed in a housing 2. On the side wall portion of the housing 2 is provided a through portion 2a, in which a connector 3 is disposed via a bushing material 4 being formed of a elastic rubber material having a square cross sectional shape. The sealing of the connector 3 in the through portion 2a is effected by contacting the inner circumferential surface of the bushing material 4 with the outer circumferential surface of the connector 3 and fitting a recess 4a provided along three quarters of the outer circumference of the bushing material in the through portion 2a of the housing 2.

A terminal (not shown) of the circuit board 1 and pins of the connector 3 are connected to each other by a conductor 31, the other terminals of the connector 3 being electrically connected to an outside circuit (not shown) through an electrically insulated wire 32. The inside of the housing 2 is filled with a filling material 5 which has insulating properties such as an epoxy resin composition. This filling material 5 is not shown in FIG. 1.

The electronic circuit apparatus constructed as mentioned above is directly mounted, for example, on an engine block of a vehicle after it is assembled as shown in the figure, and it controls, for example, ignition timing via the wiring 32.

In the electronic circuit apparatus constructed as mentioned above, since sealing is effected by using an elastic bushing material 4 mounted between the housing 2 and the connector 3, there exists the problem in that the connector 3 vibrates separately from the housing 2 or the circuit board 1 due to vibrations of the engine, whereby connector terminals (not shown) or the circuit board 1, etc. are likely to be damaged owing to this vibration.

SUMMARY OF THE INVENTION

The present invention has been devised to solve the above-mentioned problems. An object of the present invention is to provide an electronic circuit apparatus having high reliability, terminals and substrates which are not damaged due to vibration.

In order to achieve the above objects, according to the present invention, there is provided an electronic circuit apparatus comprising: a circuit board; a housing for housing the circuit board therein; a connector passing through a through portion formed in the housing for electrically connecting a circuit formed on the circuit board and an external circuit, an engagement body provided on the outer circumference of the connector; and a locking portion formed on the housing for non- elastically locking the connector to the housing by the engagement between the body and the locking portion.

These and other objects, features and advantages of the present invention will become clear from the following description of a preferred embodiment of the present invention with reference to the accompanying drawings.

DETAILED DESCRIPTION OF THE PREFERRED EMBODIMENT

One embodiment of the present invention will be explained hereinunder with reference to the accompanying drawings.

Figure 1:
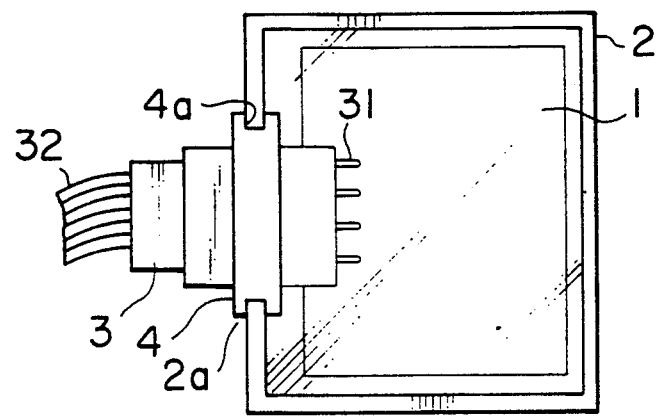
FIG. 1 is a plan view schematically illustrating a conventional electronic circuit apparatus.
Figure 2:
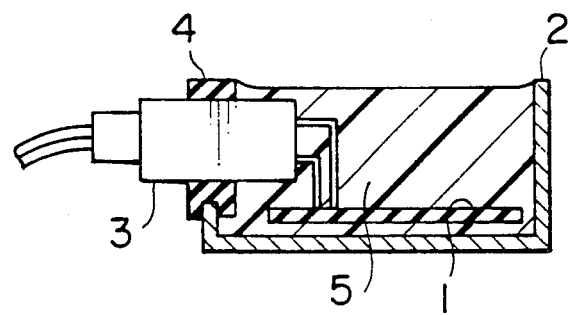
FIG. 2 is a cross-sectional side view of the apparatus shown in FIG. 1.
Figure 3:
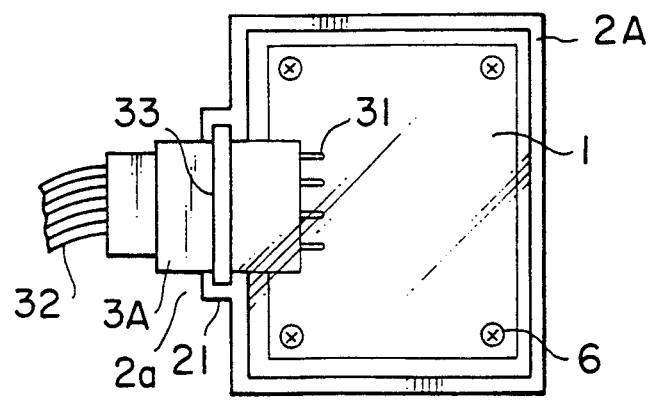
FIG. 3 is a plan view schematically illustrating an electronic circuit apparatus in accordance with one embodiment of the present invention.
Figure 4:
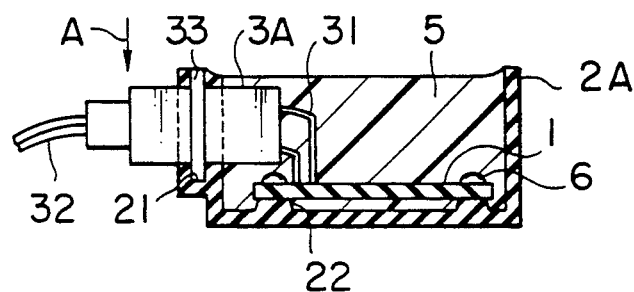
FIG. 4 is a cross-sectional side view of the apparatus shown in FIG. 3.

FIGS. 3 and 4 are a plan view and a cross-sectional side view each schematically illustrating an electronic circuit apparatus for use, for example, in an ignition timing control apparatus of an internal-combustion engine for vehicles. Referring to the figures, the outer circumference of the connector 3A has a locking portion 33 integrally formed therewith. The connector 3A is formed of a resin material. A housing 2A is injection-molded using a resin material. A recess 21, for receiving the above-mentioned locking portion 33, and locking it is integrally provided in the through portion 2a provided on the side wall portion of the housing 2A. A mounting eye 22 for holding the circuit board 1 is provided on the bottom of the housing 2A, and the circuit board 1 is fixed on the mounting eye 22 by a mounting means such as screws 6 or the like. The other members are the same as those of the above-mentioned conventional apparatus, so the explanation thereof is omitted.

In the electronic circuit apparatus constructed as mentioned above, locking is performed in such a way that the connector 3A is inserted in the direction of the arrow A of FIG. 4 with respect to the housing 2A so that the locking portion 33 which is a projection is fitted in the engagement body 21 which is a recess. At the same time, the connector 3A sealingly fits into the through portion 2a. Thereafter, the filling material or potting compound 5 is injected into the housing 2A. The filling material 5 is not shown in FIGS. 3 and 5. Thus, the connector 3a and the housing 2A are non-elastically coupled to each other. When the housing 2A is caused to vibrate due to engine vibrations, etc., the connector 3A vibrates therewith, whereby damage to terminals or the circuit board 1 is eliminated. As a result, it is possible to directly fix the circuit board 1 to the housing 2A with a screw 6 or the like and to reinforce it.

Figure 5:
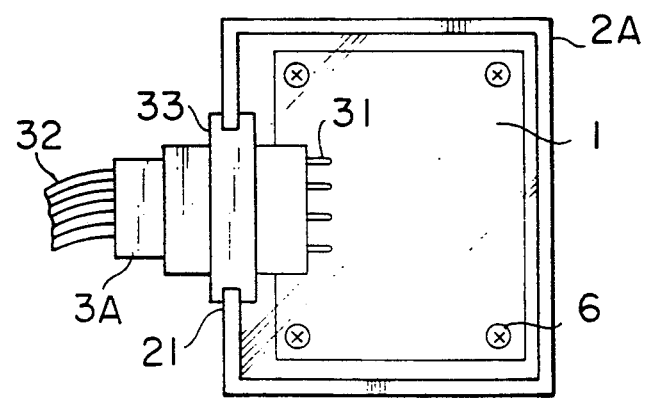
FIG. 5 is a schematic view of the electronic circuit apparatus in accordance with another embodiment of the present invention.

In the above-mentioned embodiment, the locking portion 33 is formed from a projection, and the engagement body 21 is formed as a recess. However, the present invention is not limited to this embodiment. As shown in FIG. 5, the locking portion 33 may be formed as a recess and the engagement body 21 may be formed as a projection. Needless to say, various modifications or changes can be made without departing from the spirit or scope of the present invention.

A case where the present invention is used in an ignition timing control apparatus of an internal-combustion engine for vehicles was explained in the above-mentioned embodiment. However, it goes without saying that the present invention is not limited to this embodiment.

What is claimed is:

1. An electronic circuit apparatus adapted to be mounted to a vehicle engine, comprising:
    a rigid circuit board (1);
    a rigid housing (2A) having a base and upstanding sidewalls;
    means (6) fixedly mounting the circuit board to the housing base within the sidewalls,
    an external circuit connector (3A) extending through an aperture formed in a sidewall of said housing,
    wiring means (31) electrically connecting a circuit formed on said circuit board to conductors (32) of said connector;
    engagement means (33) provided on an outer circumference of said connector and outstanding therefrom; and
    locking means (21) formed on said housing sidewall aperture for mating with said engagement means to rigidly, sealingly and non-elastically lock said connector to said housing such that the housing, the circuit board and the connector all vibrate together to thereby avoid damage to said wiring means connections.

2. An electronic circuit apparatus as claimed in claim 1, wherein said engagement means has a projection formed along an outer surface thereof, said projection fitting in a recess formed by said locking means.

3. An electronic circuit apparatus as claimed in claim 1, wherein said engagement means has a recess formed along an outer surface thereof.

4. An electronic circuit apparatus as claimed in claim 1, wherein said housing is made of a resin material.

5. An electronic circuit apparatus as claimed in claim 1, wherein said connector is made of a resin material.

6. An electronic circuit apparatus as claimed in claim 1, wherein said electronic circuit apparatus is provided in an ignition timing control apparatus of a vehicle engine.

7. An electronic circuit apparatus as claimed in claim 1, further comprising a potting compound (5) filling said housing up to tops of said sidewalls.

* * * * *